(12) United States Patent
Meyer-Berg et al.

(10) Patent No.: US 10,121,690 B2
(45) Date of Patent: Nov. 6, 2018

(54) METHOD OF MANUFACTURING A SEMICONDUCTOR COMPONENT AND SEMICONDUCTOR COMPONENT

(71) Applicant: Infineon Technologies AG, Neubiberg (DE)

(72) Inventors: Georg Meyer-Berg, München (DE); Edward Fuergut, Dasing (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/757,589

(22) Filed: Dec. 23, 2015

(65) Prior Publication Data

US 2016/0181138 A1 Jun. 23, 2016

(30) Foreign Application Priority Data

Dec. 23, 2014 (DE) .................. 10 2014 119 620

(51) Int. Cl.
| | |
|---|---|
| *H01L 21/00* | (2006.01) |
| *H01L 21/683* | (2006.01) |
| *H01L 23/00* | (2006.01) |
| *H01L 21/56* | (2006.01) |
| *H01L 23/31* | (2006.01) |

(52) U.S. Cl.
CPC .......... *H01L 21/6835* (2013.01); *H01L 24/24* (2013.01); *H01L 24/25* (2013.01); *H01L 24/82* (2013.01); *H01L 24/94* (2013.01); *H01L 24/96* (2013.01); *H01L 21/561* (2013.01); *H01L 21/568* (2013.01); *H01L 23/3107* (2013.01); *H01L 2221/6834* (2013.01); *H01L 2221/68327* (2013.01); *H01L 2221/68381* (2013.01); *H01L 2224/04105* (2013.01); *H01L 2224/06181* (2013.01); *H01L 2224/2518* (2013.01); *H01L 2224/32225* (2013.01); *H01L 2224/94* (2013.01)

(58) Field of Classification Search
CPC .......... H01L 2924/181; H01L 2224/11; H01L 21/78; H01L 2221/68327; H01L 2224/03; H01L 2224/16145
USPC ................ 438/107, 109, 111, 113, 125, 127
See application file for complete search history.

(56) References Cited

U.S. PATENT DOCUMENTS

| | | | |
|---|---|---|---|
| 2007/0158787 A1* | 7/2007 | Chanchani | .......... B81C 1/00238 257/619 |
| 2012/0326300 A1* | 12/2012 | Feng | .................. H01L 23/3114 257/737 |
| 2014/0001645 A1 | 1/2014 | Lin et al. | |

(Continued)

FOREIGN PATENT DOCUMENTS

DE 102012112758 A1 11/2013

OTHER PUBLICATIONS

English language Abstract for DE 102012112758 A1.

*Primary Examiner* — S. V. Clark

(57) ABSTRACT

Various embodiments provide method of manufacturing a semiconductor component, wherein the method comprises providing a layer stack comprising a carrier and a thinned wafer comprising a metallization layer on one side, wherein the thinned wafer is placed on a first side of the carrier; forming an encapsulation encapsulating the layer stack at least partially; and subsequently thinning the carrier from a second side of the carrier, wherein the second side is opposite to the first side of the carrier.

14 Claims, 4 Drawing Sheets

(56) References Cited

U.S. PATENT DOCUMENTS

2015/0132950 A1* 5/2015 Jung .................. H01L 24/96
438/667
2015/0179570 A1* 6/2015 Marimuthu ......... H01L 25/0652
257/774

* cited by examiner

METHOD OF MANUFACTURING A SEMICONDUCTOR COMPONENT AND SEMICONDUCTOR COMPONENT

TECHNICAL FIELD

The present invention relates to a method of manufacturing a semiconductor component. Moreover, the present invention relates to a semiconductor component.

BACKGROUND

In the art of semiconductor components a trend to for using thinner semiconductor wafers and/or the manufacturing of thinner electronic or semiconductor components can be seen. Such semiconductor components or wafers may in particular suitable for application in which a current flows vertically through the wafer or component. However, due to the low thickness of the wafers processing of the wafer or components may be difficult.

SUMMARY

Various embodiments provide method of manufacturing a semiconductor component, wherein the method comprises providing a layer stack comprising a carrier and a thinned wafer comprising a metallization layer on one side, wherein the thinned wafer is placed on a first side of the carrier; forming an encapsulation encapsulating the layer stack at least partially; and subsequently thinning the carrier from a second side of the carrier, wherein the second side is opposite to the first side of the carrier.

Furthermore, various embodiments provide a reconstituted wafer which is manufactured by a method according to an exemplary embodiment.

Moreover, various embodiments provide a semiconductor component comprising a semiconductor die comprising a multilayer structure including a backside metallization layer; and an encapsulation encapsulating at least partially the semiconductor die, wherein the backside metallization layer comprises a material having a purity in the range of at least 99.9 mass %.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which.

DETAILED DESCRIPTION

Figure 1A:
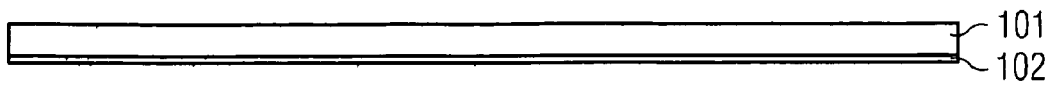
FIGS. 1A to 1F schematically illustrate steps of a method of manufacturing an electronic component according to an exemplary embodiment.

In the following further exemplary embodiments of method of manufacturing an electronic component and an electronic component. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide a method of manufacturing a reconstituted wafer, wherein the method comprises providing a layer stack comprising a carrier arranged on one side of a thinned wafer comprising a metallization layer. Subsequently, an encapsulation is formed encapsulating the thinned wafer and/or the carrier at least partially. Afterwards, the carrier and optionally the encapsulation is thinned.

In particular, the carrier may be a sacrificial carrier or structure. For example, the subsequent thinning may be a selective etching, grinding or the like. Preferably, the carrier is removed to such an extent that a second side of the thinned wafer is exposed, wherein the second side is opposite to the first side. For example, the wafer may be a semiconductor, e.g. silicon, wafer. In particular, a contact and/or redistribution layer may be formed on the metallization layer. Preferably, all sides of the layer stack may be encapsulated except of the side of the thinned layer comprising the metallization layer. Thus, it may be easily possible to further process the metallization side, e.g. by applying a further metallization layer, a structured layer and/or a redistribution layer.

By performing a thinning process or thinning step at a wafer already encapsulated at least partially by an encapsulation, e.g. a molding component, a foil or a laminate, it may be possible to provide and further process a semiconductor component having a wafer or chip of low thickness, e.g. below 100 micrometer, or even below 60 micrometer, preferably below 20 micrometer, e.g. about 5 micrometer. Due to the fact that a (thick) carrier may be present on or at the thinned wafer (e.g. the two elements or layers are bonded to each other) when further processing steps are performed, the probability of breaking of the wafer or chips of the wafer may be reduced and the complexity of the wafer or chip mounting may be reduced while at the same time the yield may be increased.

In particular, rather thin wafers, chips or semiconductor components may be enabled having a thickness of below 20 micrometer, e.g. about 5 micrometer. Furthermore, a thinning of already packaged chips or semiconductor components, possibly having flipped chips, may be enabled. Thus, a metallization may be formed at both sides of thin (flipped) chips. Moreover, a mechanical stabilizing of thin chips or wafers, e.g. below 60 micrometer, before housing or packaging and a reduced warpage may be enabled due to the provision of an (intrinsic) carrier. Furthermore, the total number of processing steps may be reduced due to the provision of an integral or intrinsic carrier and/or encapsulation. The using of a (glass) carrier may as well enable the forming of backside (copper) contacts configured for applying high power, i.e. for power application like power modules or in rectifiers, even when standard wafers are used. In addition bare-die handling may be possible when mounting the die to a PCB. It should be noted that a backside metallization or metallization layer may particular be formed by a sputtering process. Such a sputtering process may enable a higher purity level than a plating process. In particular, the purity level may be at least 99.9 mass %, more particularly about 99.99 mass % or even about 99.995 mass %. For example, the backside metallization layer may comprise or consist of a material (e.g. copper) having the above purity levels. Furthermore, the amount of Cl may be in the ppm range, e.g. less than 50 ppm, particular less than 10 ppm or even below 1 ppm. These values may be typical for sputter processes (e.g. caused by the purity level of copper sputter targets) but hardly or impossible to achieve by other deposition processes. It should be mentioned that the described methods of manufacturing a semiconductor component according to exemplary embodiments may enable the use of sputtering processes. Such sputtering processes may not be possible when using known methods.

In general, a method according to an exemplary embodiment may comprise a thinning on wafer level, wherein the wafer is attached to a (sacrificial) carrier, and a subsequent further (selective) thinning in an already packaged or encapsulated stage. Thus, a surface metallization at or on both sides of a thin wafer may be enabled while still the handling may be relatively easy and robust due to the use of the (sacrificial) carrier. In particular, the electronic component may be part of a reconstituted wafer or may be manufactured from a reconstituted wafer.

In the following exemplary embodiments of the method of manufacturing an electronic component are described. However, the features and elements described with respect to these embodiments can be combined with exemplary embodiments of the electronic component.

According to an exemplary embodiment the method further comprises dicing the layer stack before forming the encapsulation.

According to an exemplary embodiment of the method the layer stack comprises an adhesive layer arranged between the thinned wafer and the carrier. In particular, the adhesive layer may be formed by applying an adhesive paste and/or an adhesive film.

In particular, the adhesive layer may comprise a polyimide. The use of polyimide as a basis for the adhesive may be beneficial, since polyimide is a typical and often used adhesive. Thus, it may be suitable for many standard processes. While by known methods the use of an adhesive comprising or based on cured polyimide is not possible (since the striping or removing of the adhesive is performed by use of heat which would lead to a too high temperature, when this should be performed while using a polyimide adhesive), according to the present method the stripping or removing may easily performed by etching and/or an mechanical removing, like grinding or polishing. Thus, also an adhesive withstanding a high temperature may be used.

According to an exemplary embodiment of the method the adhesive layer is used as a stop layer in the subsequently thinning.

In particular, the adhesive layer may form a stop layer for an etching process and/or polishing or grinding process.

According to an exemplary embodiment of the method the adhesive layer is removed after the subsequent thinning.

In particular, the adhesive layer may be removed by an etching process, e.g. by using any suitable etching agent like nitric acid.

According to an exemplary embodiment of the method the subsequent thinning of the carrier is performed to such an extent that a second side of the thinned wafer is exposed, wherein the second side is opposite to the one side.

According to an exemplary embodiment the method further comprises forming a further metallization layer on the second side of the thinned wafer.

Thus, it may be possible to provide a semiconductor component having formed a metallization layer on both (main) sides or main surfaces of the wafer. In particular, a contact layer and/or a redistribution layer may be formed on the further metallization layer.

According to an exemplary embodiment of the method the carrier comprises at least one material selected out of the group consisting of glass, silicon, ceramic, and carbon.

According to an exemplary embodiment of the method the providing of the layer stack comprises placing the thinned wafer on the first side of the carrier.

In particular, the carrier may be a sacrificial wafer, e.g. a silicon wafer. Such a sacrificial wafer may in particular ease the handling of the layer stack and/or the wafer in the further processing but will be removed afterwards.

According to an exemplary embodiment of the method an adhesion layer is formed between the thinned wafer and the carrier.

In particular, the adhesion layer may be formed on the carrier and/or on the thinned layer before the thinned wafer is placed (or glued) to the carrier.

According to an exemplary embodiment of the method the subsequent thinning is performed by an etching process.

In particular, the subsequent thinning may be performed by using a (selective) etching process only etching the carrier while (substantially) not etching the adhesion layer. Thus, the adhesion layer may form an etch stop layer. For example, tetrafluoromethane may be used for removing the carrier. In an additional step another etching agent, like nitric acid, may be used to remove the adhesion layer as well, so that a second side (e.g. frontside) of the wafer may be exposed. Subsequently an optional second metallization layer may be formed on the exposed second side According to an exemplary embodiment of the method the providing of the layer stack comprises placing a thick wafer on the first side of the carrier and thinning the thick wafer to form the thinned wafer of the layer stack.

In particular, the subsequently thinning of the carrier may be performed by a polishing, abrasion, grinding process, and/or etching process.

According to an exemplary embodiment of the method the thinning of the thick wafer is performed after the thick wafer is placed on the first side of the carrier and before the forming of the encapsulation.

According to an exemplary embodiment the method further comprises placing a further carrier on the side of the metallization layer before forming the stacked layer.

In particular, the further carrier may be a glass carrier or silicon carrier. For example, the further carrier may be a handling wafer which is connected or bonded to the wafer in order to enable an easy handling of the wafer.

According to an exemplary embodiment of the method the further carrier is placed on the wafer before the wafer is thinned.

In particular, the carrier may be fixed or bonded to the metallization layer of the wafer. After, the further carrier is placed or bonded to the wafer the wafer may be thinned by one of the before mentioned processes. Additionally or alternatively the further carrier may be thinned or removed as well. The further carrier may be thinned or removed before the layer stack is encapsulated but after the carrier is placed on the wafer (thinned or unthinned).

In the following specific embodiments of the method of manufacturing an electronic component will be described in more detail with respect to the figures.

Figure 1B:
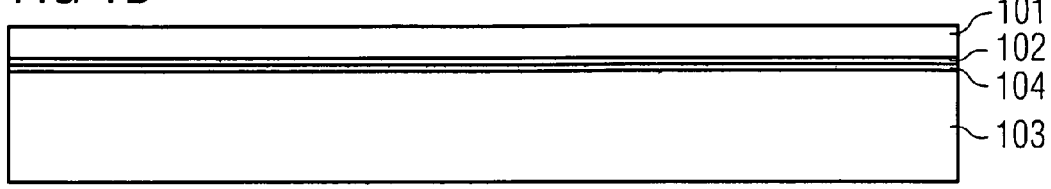
Figure 1C:
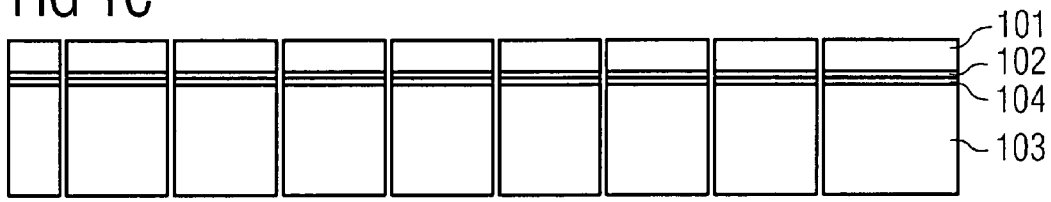

FIGS. 1A to 1F schematically illustrate steps of a method of manufacturing an electronic component according to an exemplary embodiment. In particular, FIG. 1A shows an already thinned wafer 101 having a (structured) metallization layer 102 on its backside. Then a (sacrificial) carrier, e.g. silicon carrier, 103 is bonded to the wafer 101 by an adhesive layer 104 (FIG. 1B). For example, the adhesive layer may comprise or may be made of a polyimide, having a high temperature stability. Afterwards the layer stack comprising the thinned wafer 101 and the (sacrificial) carrier is diced, e.g. by a sawing process (FIG. 1C).

Figure 1D:
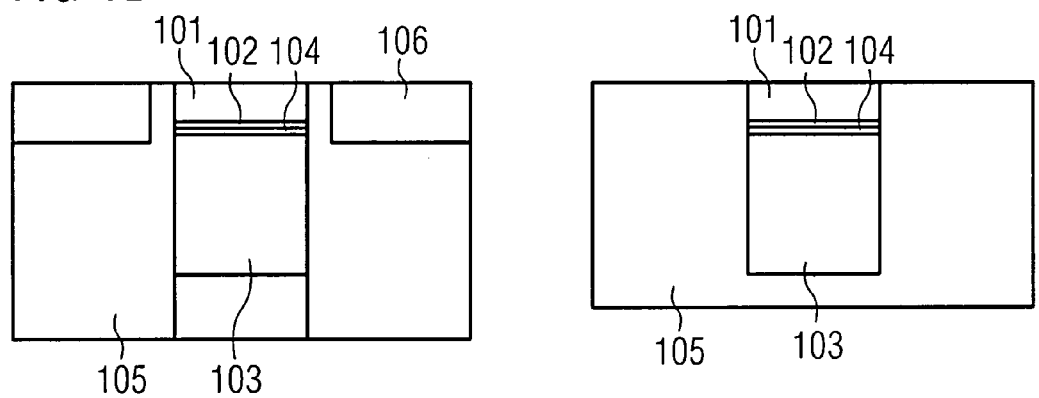
Figure 1E:
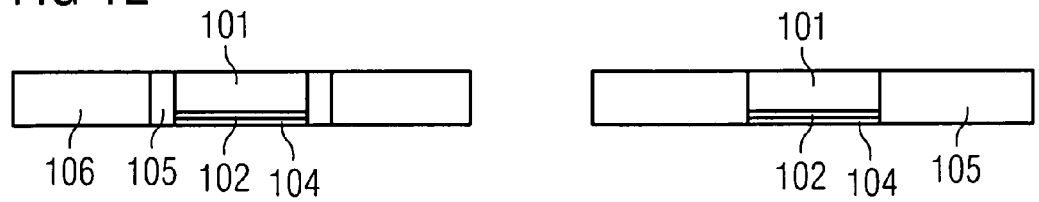

Afterwards, the singularized layer stacks (comprising the sawed wafer and carrier) are encapsulated by a molding compound 105. Preferably, this is performed in a way that the frontside of the wafer 101 or chip is spared of the molding compound, i.e. is still exposed (FIG. 1D). In additional some optional contact regions 106, e.g. formed by electrically conductive material, e.g. metal, are schematically depicted in FIG. 1D on the left side, while at the right side these optional contact regions are omitted. Then the carrier (arranged on the backside of the wafer) is removed by thinning the backside by an etching agent, like tetrafluoromethane, removing the material of the carrier 103 up to the adhesive layer 104. Tetrafluoromethane may be a suitable etching agent for selective etching in case the carrier is formed by a silicon carrier (FIG. 1E).

Figure 1F:
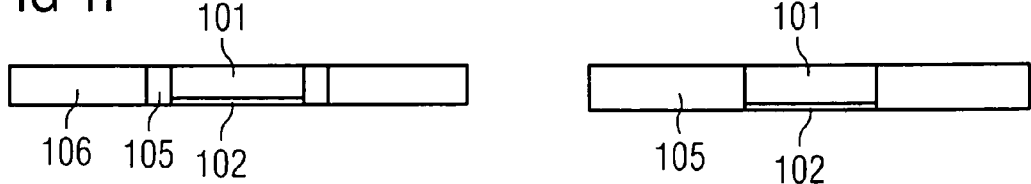

In a subsequent step the adhesive layer 104 is removed, e.g. by using another etching agent, like nitric acid. It should be noted that the (sacrificial carrier) and/or the adhesive layer may as well be removed by a mechanical or a combined removing process including grinding and/or polishing (FIG. 1F). Additionally, further processing may be performed on the frontside and/or backside of the encapsulated wafer or die.

Figure 2A:
FIGS. 2A to 2I schematically illustrate steps of a method of manufacturing an electronic component according to another exemplary embodiment.
Figure 2B:
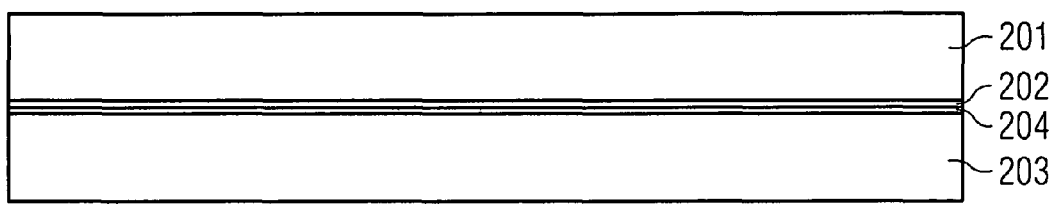
Figure 2C:

FIGS. 2A to 2I schematically illustrate steps of a method of manufacturing an electronic component according to another exemplary embodiment. In particular, FIG. 2A shows a thick wafer 201 having a (structured) metallization layer 202 on its frontside. In a subsequent step a carrier, e.g. a glass carrier, 203 is bonded to the thick wafer 201 by an adhesive layer 204 (FIG. 2B). In particular, the carrier is bonded to the metallization layer 202. Then the thick wafer 201 is thinned, e.g. by an etching agent and/or mechanical process. The thinning may be performed to an extent that only a thin wafer (having a thickness of less than 20 micrometer, e.g. about 5 micrometer) remains. Then the backside of the wafer may be metallized (and structured) to form a (structured) metallization layer 210. The metallization may be performed by a sputtering process, for example (FIG. 2C).

Figure 2D:
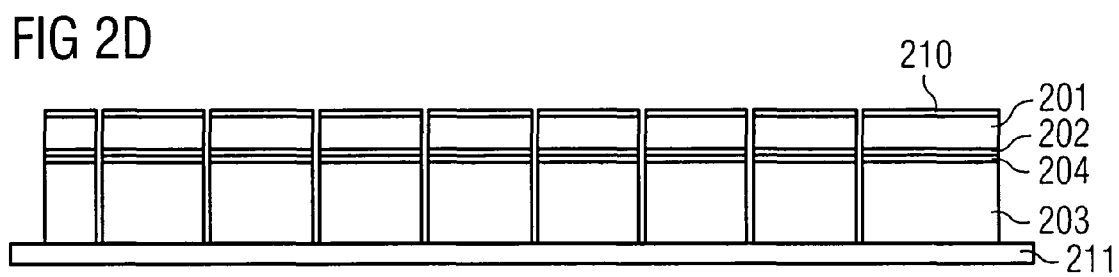

Afterwards the layer stack comprising the thinned wafer 201 and the (sacrificial) carrier 203 is diced, e.g. by a sawing process. This is schematically depicted in FIG. 2D, wherein an additional optional glass carrier 211 is as well shown in FIG. 2D.

Figure 2E:
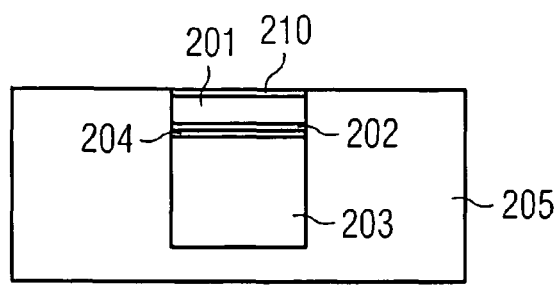
Figure 2F:
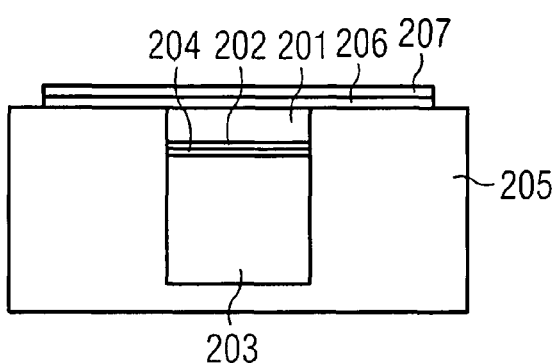

Afterwards, the singularized layer stacks (comprising the sawed wafer and carrier) are encapsulated by a molding compound 205. Preferably, this is performed in a way that the backside of the wafer 201 or chip is spared of the molding compound, i.e. is still exposed (FIG. 2E). Then the backside of the wafer/chip is contacted by a structured layer 206 and/or a redistribution layer 207 (FIG. 2F).

Figure 2G:
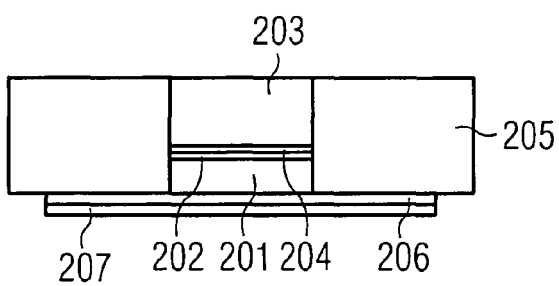
Figure 2H:
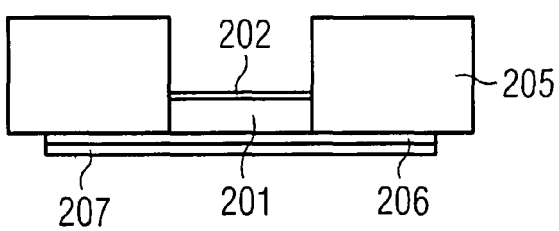

Then the "frontside" of the encapsulated or reconstituted wafer is processed, e.g. by grinding, to remove portions of the encapsulation 205 and the carrier 203 (FIG. 2G). Afterwards, the remaining portions of the carrier 203 and the adhesive layer 204 is removed, e.g. by applying an etching agent (FIG. 2H).

Figure 2I:
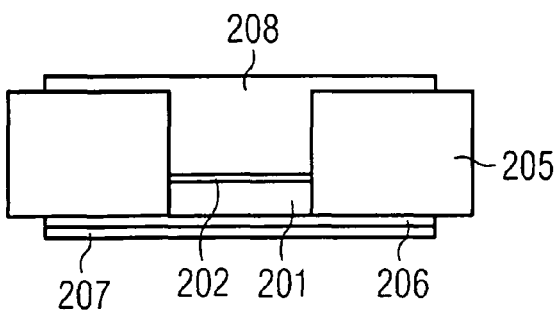

Subsequently, the frontside of the wafer 201 is contacted or metallized by an additional metallization layer 208 as depicted in FIG. 2I.

Figure 3A:
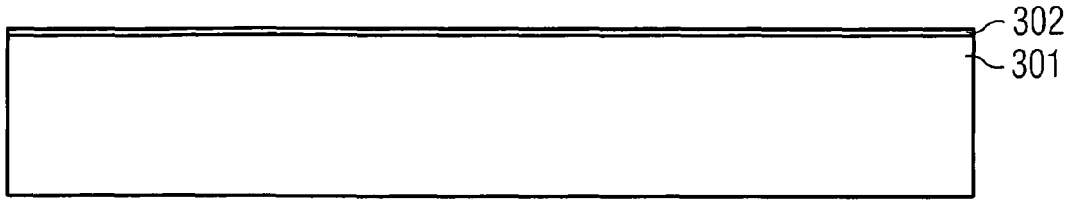
FIGS. 3A to 3C schematically illustrate additional steps of a method of manufacturing an electronic component according to the embodiment of FIG. 2.
Figure 3B:
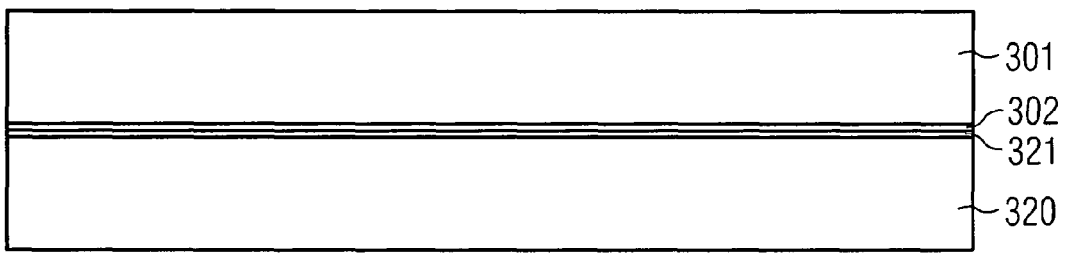
Figure 3C:
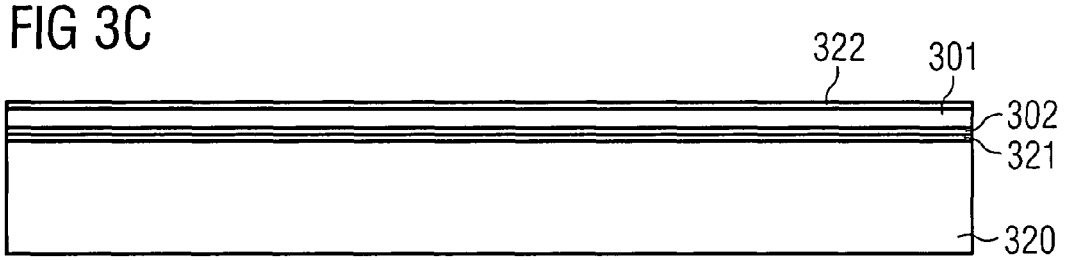

FIGS. 3A to 3C schematically illustrate additional steps of a method of manufacturing an electronic component according to the embodiment of FIG. 2. In particular, some additional steps may be performed before the carrier (203 in FIG. 2B) is bonded or adhered to a wafer. FIG. 3A shows a thick or unthinned wafer 301 having a (structured) metallization layer 302 on its frontside. Subsequently, an auxiliary carrier 320 is (temporarily) bonded to the metallization layer 302 (FIG. 3B), e.g. by an adhesive layer 321.

Afterwards the wafer 301 is thinned (e.g. as described in the context of FIGS. 1 and 2). Then the backside of the thinned wafer 301 is metallized as well by a (structured) additional metallization layer 322 as schematically depicted in FIG. 3C. Starting from this layer stack the process as described in FIG. 2 may be performed, in particular, starting from FIG. 2A, wherein the wafer has already metallization layers on front- and backside.

Figure 4:
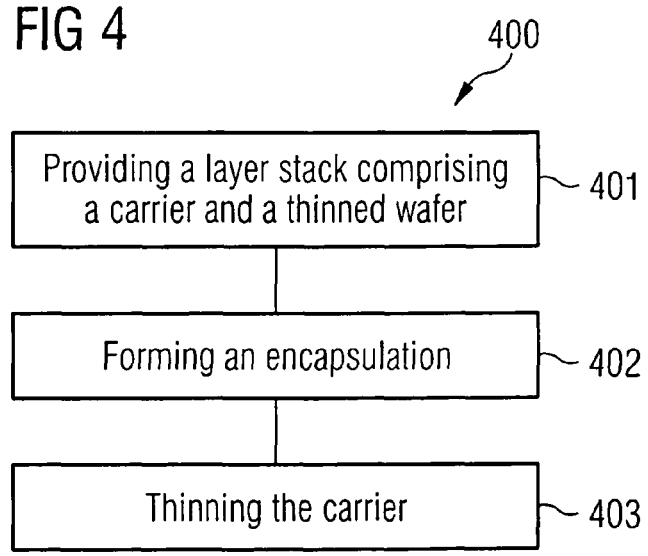
FIG. 4 schematically illustrates a flowchart of a method of manufacturing a semiconductor component according to an exemplary embodiment.

FIG. 4 schematically illustrates a flowchart of a method of manufacturing a semiconductor component according to an exemplary embodiment. In particular, the method 400 comprises providing a layer stack comprising a carrier and a thinned wafer comprising a metallization layer on one side, wherein the thinned wafer is placed on a first side of the carrier (step 401) It should be mentioned that the layer stack of carrier and thinned wafer may be formed by attaching or bonding an already thinned wafer to the carrier or by attaching or bonding an unthinned or thick wafer to the carrier which is then thinned as part of the layer stack.

In a further step an encapsulation encapsulating the layer stack at least partially is formed (step 402) which is followed by subsequently thinning of the carrier from a second side of the carrier, wherein the second side is opposite to the first side of the carrier (step 403).

Thus, a method or process comprising a specific thinning and/or processing before an encapsulating or packaging and outside of the package may be provided, which may enable that both wafer/chip surfaces may be processed or metallized, even in case the packaged wafer/chip has a low thickness, e.g. below 60 micrometer or even below 20 micrometer, e.g. about 5 micrometer.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of manufacturing a semiconductor component, the method comprising:
   providing a layer stack comprising a carrier and a thinned wafer comprising a metallization layer on one side, wherein the thinned wafer is placed on a first side of the carrier;
   forming an encapsulation encapsulating the layer stack at least partially; and subsequently thinning the carrier from a second side of the carrier, wherein the second side is opposite to the first side of the carrier;

wherein the method further comprises:

dicing the layer stack before forming the encapsulation.

2. The method according to claim 1, wherein the subsequent thinning of the carrier is performed to such an extent that a second side of the thinned wafer is exposed, wherein the second side is opposite to the one side.

3. The method according to claim 2, further comprising forming a further metallization layer on the second side of the thinned wafer.

4. The method according to claim 1, wherein the carrier comprises at least one material selected out of the group consisting of:
glass;
silicon;
ceramic; and
carbon.

5. The method according to claim 1, wherein the providing of the layer stack comprises placing the thinned wafer on the first side of the carrier.

6. The method according to claim 5, wherein an adhesion layer is formed between the thinned wafer and the carrier.

7. The method according to claim 6, wherein the subsequent thinning is performed by an etching process.

8. The method according to claim 1, wherein the providing of the layer stack comprises placing a thick wafer on the first side of the carrier and thinning the thick wafer to form the thinned wafer of the layer stack.

9. The method according to claim 8, wherein the thinning of the thick wafer is performed after the thick wafer is placed on the first side of the carrier and before the forming of the encapsulation.

10. A reconstituted wafer manufactured by a method according to claim 1.

11. A method of manufacturing a semiconductor component, the method comprising:

providing a layer stack comprising a carrier and a thinned wafer comprising a metallization layer on one side, wherein the thinned wafer is placed on a first side of the carrier;

forming an encapsulation encapsulating the layer stack at least partially; and subsequently thinning the carrier from a second side of the carrier, wherein the second side is opposite to the first side of the carrier, wherein the layer stack comprises an adhesive layer arranged between the thinned wafer and the carrier, and wherein the adhesive layer is used as a stop layer in the subsequently thinning.

12. The method according to claim 11, wherein the adhesive layer is removed after the subsequent thinning.

13. A method of manufacturing a semiconductor component, the method comprising:

providing a layer stack comprising a carrier and a thinned wafer comprising a metallization layer on one side, wherein the thinned wafer is placed on a first side of the carrier;

forming an encapsulation encapsulating the layer stack at least partially; and subsequently thinning the carrier from a second side of the carrier, wherein the second side is opposite to the first side of the carrier;

wherein the method further comprises:

placing a further carrier on the side of the metallization layer before forming the stacked layer.

14. The method according to claim 13, wherein the further carrier is placed on the wafer before the wafer is thinned.

* * * * *